(12) United States Patent
Pycroft

(10) Patent No.: US 8,841,547 B1
(45) Date of Patent: *Sep. 23, 2014

(54) CONCENTRATED PHOTOVOLTAIC RECEIVER PACKAGE WITH BUILT-IN CONNECTOR

(75) Inventor: Garry Pycroft, Cupertino, CA (US)

(73) Assignee: Amkor Technology, Inc., Chandler, AZ (US)

( * ) Notice: Subject to any disclaimer, the term of this patent is extended or adjusted under 35 U.S.C. 154(b) by 766 days.

This patent is subject to a terminal disclaimer.

(21) Appl. No.: 12/577,064

(22) Filed: Oct. 9, 2009

(51) Int. Cl.
*H01L 31/0203* (2014.01)

(52) U.S. Cl.
USPC .......................................... 136/259; 136/256

(58) Field of Classification Search
None
See application file for complete search history.

(56) References Cited

U.S. PATENT DOCUMENTS

| | | | |
|---|---|---|---|
| 4,257,823 A | 3/1981 | Bevilaqua et al. | |
| 5,622,873 A | 4/1997 | Kim et al. | |
| 5,631,191 A | 5/1997 | Durand et al. | |
| 6,005,287 A * | 12/1999 | Kaiya et al. | 257/674 |
| 6,013,935 A | 1/2000 | Shie | |
| 6,040,620 A | 3/2000 | Sugimoto | |
| 6,281,568 B1 | 8/2001 | Glenn et al. | |
| 6,395,972 B1 * | 5/2002 | Tran et al. | 136/251 |
| 6,650,004 B1 | 11/2003 | Horie | |
| 6,707,138 B2 | 3/2004 | Crowley et al. | |
| 6,756,658 B1 | 6/2004 | Gillett | |
| 6,794,740 B1 | 9/2004 | Edwards et al. | |
| 6,815,244 B2 | 11/2004 | Bottner et al. | |
| 6,844,615 B1 | 1/2005 | Edwards et al. | |
| 6,897,567 B2 | 5/2005 | Horie et al. | |
| 7,001,799 B1 | 2/2006 | Edwards et al. | |
| 7,002,241 B1 | 2/2006 | Mostafazadeh | |
| 2004/0222484 A1 | 11/2004 | Saxelby et al. | |
| 2005/0133878 A1 | 6/2005 | Huang | |
| 2005/0161777 A1 | 7/2005 | Horie | |
| 2006/0006506 A1 | 1/2006 | Watanabe et al. | |
| 2007/0178630 A1 | 8/2007 | Huang | |
| 2007/0296077 A1 | 12/2007 | Moline | |
| 2008/0295888 A1 | 12/2008 | Lai et al. | |
| 2009/0114264 A1 | 5/2009 | Giampietro et al. | |
| 2009/0120499 A1 * | 5/2009 | Prather et al. | 136/259 |
| 2009/0159128 A1 | 6/2009 | Shook et al. | |
| 2010/0259909 A1 | 10/2010 | Ho et al. | |

FOREIGN PATENT DOCUMENTS

JP   2008294219 A   12/2008

OTHER PUBLICATIONS

Amkor Technology, Inc., Data Sheet for "PLCC." Jul. 2003.

* cited by examiner

*Primary Examiner* — Jayne Mershon
(74) *Attorney, Agent, or Firm* — Kevin B. Jackson

(57) ABSTRACT

In one embodiment, a concentrated photovoltaic module or receiver package comprises a leadframe including a first section and a second section disposed in spaced relation to each other. Mounted to the first section of the leadframe is a receiver die. The receiver die is electrically connected to both the first and second sections of the leadframe. The receiver die is electrically connected to the second section of the leadframe by a plurality of conductive wires. The receiver die and portions of the leadframe are covered by a molded body which can be used to define an alignment feature for a light concentrating device such as a light guide or optical rod. Portions of the first and second sections of the leadframe protruding from the body are sized and configured to define integrated cable connectors for the receiver package.

20 Claims, 2 Drawing Sheets

CONCENTRATED PHOTOVOLTAIC RECEIVER PACKAGE WITH BUILT-IN CONNECTOR

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices and, more particularly, to a robust, cost effective leadframe structure which includes one or more built-in connectors for cables and is particularly suitable for a concentrated photovoltaic (CPV) receiver module.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a receiver die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration. In certain existing CPV modules, the electrical connection of the receiver die to the conductive pattern is facilitated by the use of multiple wires bonded to the bus bar on the receiver die and the bond pads of the conductive pattern of the substrate, the wires being used as an alternative to the aforementioned braided ribbon or mesh interconnects. The CPV module may further include a light concentration means which is adapted to concentrate solar radiation onto the front surface of the receiver die.

However, one of the major disadvantages associated with currently known CPV modules is attributable to the relatively high cost associated with their assembly and testing. Another deficiency lies with the lower conversion efficiency resulting from the higher receiver die temperatures. These higher temperatures of the receiver die are often attributable to the inefficiencies of known CPV modules in dissipating heat. In order to address these disadvantages, Applicant developed a robust, cost effective leadframe structure for integration into a CPV receiver package, such leadframe structure being described with particularity in Applicant's U.S. patent application Ser. No. 12/348,853 entitled LEADFRAME STRUCTURE FOR CONCENTRATED PHOTOVOLTAIC RECEIVER PACKAGE filed Jan. 5, 2009, the disclosure of which is incorporation herein by reference. Though the leadframe based CPV receiver packages such as those described in U.S. patent application Ser. No. 12/348,853 address and overcome many of the major disadvantages with the ceramic substrate based CPV receiver packages described above, such leadframe based CPV packages still typically require a connection to be attached for permitting cables to be serially coupled between the receiver die of the receiver package. In this regard, current designs of leadframe based CPV receiver packages often include cavities in the mold cap which permit the cables to be either soldered to the leadframe or to a connector attached to the leadframe. The present invention provides a further enhancement to these leadframe based CPV receiver packages by creating the connector(s) for the cables from the core leadframe. As a result, no additional connectors are required, with the cables having a firm attachment to the leadframe. Costly supplemental connectors are thus eliminated, with the leadframe based CPV receiver package including the connectors having improved reliability versus a non-connector solution. In this regard, serious reliability issues arise when attempts are made to solder the cables to a leadframe which has no connectors. These, and other features and advantages of the present invention, will be described in more detail below.

BRIEF SUMMARY OF THE INVENTION

In accordance with one embodiment of the present invention, there is provided a robust, compact CPV (concentrated photovoltaic) module or receiver package which comprises a strip-based leadframe substrate. The receiver package is finished by film-assist molding to expose the receiver die surface on a first side thereof, and a heat slug or heat sink on a second side thereof opposite the first side. Thus, the CPV receiver package provides effective thermal dissipation, wire protection, electrical insulation, strip-level assembly and test capability, as well as molded alignment features which are adapted to accommodate an electromagnetic radiation concentration device such as a light guide or optical rod which concentrates solar radiation onto the receiver die.

More particularly, the multiple wire bonds included in the CPV receiver package of the aforementioned embodiment provide for high power transmission, with the molded body included therein providing protection for the bond wires, as well as molded features for light guide or optical rod alignment. This CPV receiver package also includes integrated leads for cabling, and the aforementioned built-in, exposed heat sink for heat dissipation. Further, the strip based assembly and test capability of such CPV receiver package allows for the full automation of the assembly and testing thereof, thus providing significant cost benefits in relation to the fabrication process.

In addition, the leadframe of the CPV receiver package of the present invention is uniquely configured to include one or more connectors which are sized and configured to facilitate the electrical connection of one or more cables to the receiver package, and in particular to the leadframe thereof. The connectors may be formed by curling or bending portions of the leadframe which protrude from a molded body of the CPV receiver package. The bending of these prescribed, exposed portions of the leadframe may occur either before or subsequent to the interface of a corresponding cable thereto. Those portions of the leadframe which are ultimately bent to define the cable connectors may optionally be half-etched depending upon the final leadframe thickness so as to facilitate greater ease in the bending process. As indicated above, the integration of the connectors into the leadframe of the CPV receiver package of the present invention facilitates the firm attachment of the cables to the leadframe without the need for supplemental connectors, the use of which could otherwise give rise to reliability issues.

In sum, as indicated above, the aforementioned CPV receiver package provides a cost-effective, robust, compact package which uses film-assist molding of durable molding material, and includes multiple wire bonds, an exposed thermal pad (heat sink), exposed, easy-access integrated cable connectors, and molded-in features to help align an optical rod or light guide. As a result, such CPV receiver package provides the required combination of good thermal dissipation to the heat sink, protection against intense, focused sunlight, high voltage potential isolation, accurate alignment of the optical rod or light guide, and ease of cable connection.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
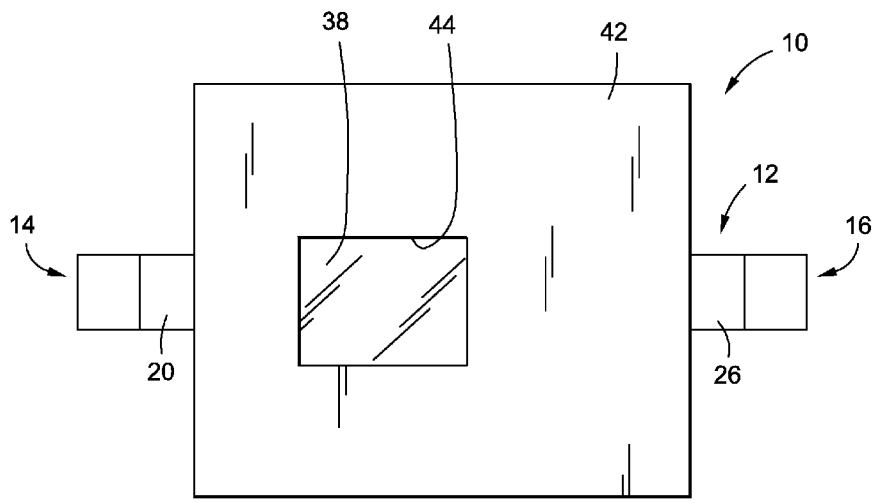
FIG. 1 is a top plan view of a CPV receiver package constructed in accordance with a first embodiment of the present invention.
Figure 2:
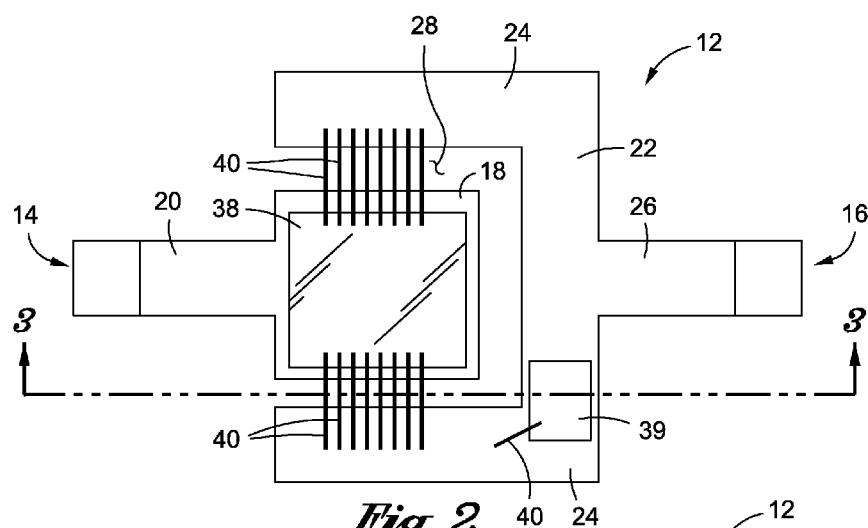
FIG. 2 is a top plan view of the CPV receiver package of the first embodiment similar to FIG. 1, but with the molded body removed for purposes of clearly depicting the leadframe of the CPV receiver package.
Figure 3:
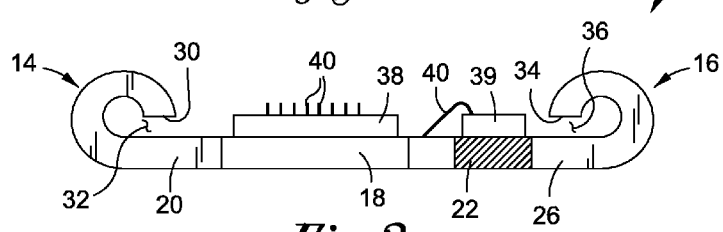
FIG. 3 is a cross-sectional view taken along line 3-3 of FIG. 2.

Referring now to the drawings wherein the showings are for purposes of illustrating preferred embodiments of the present invention only, and not for purposes of limiting the same, FIGS. 1-3 depict a CPV module or receiver package 10 constructed in accordance with a first embodiment of the present invention. As best seen in FIGS. 2 and 3, the receiver package 10 comprises a leadframe 12 which is preferably fabricated from a conductive metal material, such as copper. The leadframe 12 includes a first section 14 and a separate second section 16. The first section 14 includes a generally quadrangular (e.g., rectangular) die pad portion 18 which defines opposed pairs of longitudinally and laterally extending side edges. Extending from the approximate center of one of the laterally extending side edge of the die pad portion 18 is a generally quadrangular (e.g., rectangular) connector portion 20 of the first section 14, the connector portion 20 defining a distal end 30.

The second section 16 of the leadframe 12 includes a generally quadrangular (e.g., rectangular) base portion 22 defining opposed pairs of longitudinally and laterally extending side edges. In addition to the base portion 22, the second section 16 includes an identically configured pair of prong portions 24 which extend in spaced, generally parallel relation to each other from a common longitudinally extending side edge of the base portion 22. Additionally, extending from the longitudinally extending side edge of the base portion 22 opposite the side edge having the prong portions 24 extending therefrom is a generally quadrangular (e.g., rectangular) connector portion 26 of the second section 16, the connector portion 26 preferably being identically configured to the connector portion 20 of the first section 14 and defining a distal end 34. As is further seen in FIG. 2, the base portion 22 and prong portions 24 of the second section 16 collectively define a generally square gap or recess 28 which is sized and configured to accommodate the die pad portion 18 of the first section 14. More particularly, in the leadframe 12, the first and second sections 14, 16 are oriented relative to each other such that the die pad portion 18 is disposed within the recess 28. However, the first and second sections 14, 16 are maintained in spaced relation to each other, with a continuous gap or void being defined therebetween as shown in FIG. 2.

As is further apparent from FIG. 3, in the leadframe 12, the first section 14 is of uniform thickness, as is the second section 16. The thicknesses of the first and second sections 14, 16 are also equal to each other, but may optionally be varied without departing from the spirit and scope of the present invention. However, though not shown, it is contemplated that the connector portions 20, 26 of the first and second sections 14, 16 may each be subjected to a partial etching process for reasons which will be discussed in more detail below.

As best shown in FIG. 3, in the receiver package 10, distal portions of the connector portions 20, 26 of the first and second sections 14, 16 of the leadframe 12 are each bent or curled upwardly and inwardly when viewed from the perspective shown in FIG. 3 to impart a generally circular profile thereto. In this regard, as apparent from FIG. 3, when the connector portion 20 is bent, the distal end 30 thereof faces or is directed toward a portion of the top surface of the connector portion 20, the distal end 30 being separated from such portion of the top surface of the connector portion 20 by a relatively narrow gap 32. Similarly, when the connector portion 26 is bent, the distal end 34 thereof faces or is directed toward a portion of the top surface of the connector portion 26, the distal end 34 being separated from such portion of the top surface of the connector portion 26 by a relatively narrow gap 36. Advantageously, the bent or curled distal portions of the connector portions 20, 26 each define a connector which is uniquely configured to facilitate the electrical connection of a corresponding cable to the leadframe 12, and hence the receiver package 10. As will be recognized, the connector of the first section 14 facilitates the electrical coupling of a cable thereto, with the connector of the second section 16 facilitating the electrical coupling of a cable thereto.

In the receiver package 10, the thickness of the connector portions 20, 26, along with the size or width of the gaps 32, 36 defined between the distal ends 30, 34 and top surface portions of respective ones of the connectors 20, 26, is preferably selected so as to impart a prescribed level of flexion or resilience to the connectors as may be needed to facilitate the operative interface of cables thereto. As indicated above, to provide a prescribed level of flexion or resilience to the connectors, the thicknesses of at least the distal portions of the connector portions 20, 26 may be selectively reduced through the use of, for example, a partial or half-etching process prior to the bending or curling thereof to form the connectors. As will be recognized, the reduced thickness of the distal portions of the connector portions 20, 26 also makes easier the actual bending or curling process, in addition to providing the aforementioned increased flexion or resiliency characteristics. Though each of the connectors of the leadframe 12 as shown in FIG. 3 is depicted as having a generally circular profile, those of ordinary skill in the art will recognize that such connectors may have differing shapes without departing from the spirit and scope of the present invention.

The receiver package 10 constructed in accordance with the present invention further comprises a receiver die 38, the back or bottom surface of which is mounted and electrically connected to the top surface of the die pad portion 18 of the first section 14 of the leadframe 12 when viewed from the perspective shown in FIG. 3. The receiver die 38 has a generally quadrangular (e.g., square) configuration, and includes two contact strips disposed on the front or top surface thereof. The contact strips extend in spaced, generally parallel relation to each other along respective ones of an opposed pair of side edges of the receiver die 38. In the receiver package 10, each of the contact strips is electrically connected to a respective one of the prong portions 24 of the second section 16 of the leadframe 12 by a plurality of conductive wires 40. As shown in FIGS. 2 and 3, it is contemplated that in addition to the receiver die 38, the receiver package 10 will include an electronic device 39 such as a packaged diode or a rectifier die attached to the top surface of the base portion 22 of the second section 16. The electronic device 39 will itself be electrically connected to one of the prong portions 24 of the second section 16 through the use of at least one conductive wire 40.

In the receiver package 10, the receiver die 38, the electronic device 39, the conductive wires 40 and portions of the first and second sections 14, 16 of the leadframe 12 are covered by an encapsulant material which, upon hardening, defines a molded body 42 of the receiver package 10. As seen in FIG. 1, the body 42 has a generally square, frame-like configuration. More particularly, the body 42 is formed such that virtually the entire leadframe 12 is covered thereby, except for the majority of the connector portions 20, 26 and the bottom surfaces of the first and second sections 14, 16 (and thus the bottom surface of the die pad portion 18 of the first section 14). In this regard, the connector portions 20, 26 protrude from respective ones of an opposed pair of side surfaces defined by the body 42, with the bottom surfaces of the first and sections 14, 16, except for the portions defined by the curved or bent distal end portions of the connector portions 20, 26 forming the cable connectors, extending in substantially flush relation to a generally planar bottom surface defined by the body 42. Thus, the bottom surface of the die pad portion 18 of the first section 14 also extends in substantially flush relation to the bottom surface of the body 42. In the completed receiver package 10, the top surface of the receiver die 38, except for a peripheral portion thereof, is exposed in a generally quadrangular window 44 defined by the body 42 and formed within the approximate center of the generally planar top surface thereof. Though not shown, it is contemplated that the window 44 may have a tapered profile, i.e., those surfaces of the body 42 defining the window 44 may extend angularly from the top surface of the body 42 to the top surface of the receiver die 38. Though also not shown in FIG. 1, it is further contemplated that the body 42 may alternatively be formed such that portions of the prong portions 24 of the second section 16 of the leadframe 12 protrude slightly from respective ones of an opposed pair of side surfaces of the body 42.

In an exemplary operative environment for the receiver package 10 having the above described structural attributes, the fully formed receiver package 10 may be attached to an underlying heat sink through the use of a layer of a thermal interface material. Additionally, it is contemplated that a light concentrating device such as a light guide or optical rod may be cooperatively engaged to the receiver package 10. More particularly, one end of the optical rod may be secured to that portion of the top surface of the receiver die 38 exposed in the window 44 through the use of a layer of an index matching glue. The tapered or angled side walls of the body 42 defining the window 44, if included, may define an alignment feature which properly aligns the optical rod over the receiver die 38. Advantageously, the exposed bottom surface of the die pad portion 18 of the first section 14 within the body 42 acts as a heat sink and creates a thermal dissipation benefit in the receiver package 10. More particularly, heat transferred from the receiver die 38 into the die pad portion 18 can in turn be transferred from the exposed bottom surface of the die pad portion 18 into the underlying heat sink via the layer of thermal interface material therebetween. Those of ordinary skill in the art will further recognize that side walls of the body 42 defining the window 44 may alternatively be stepped or otherwise mechanically adapted in a manner adapted to facilitate the alignment of the optical rod (or other light concentrating device) with the portion of the receiver die 38 exposed in the window 44. Due to the structural attributes of the leadframe 12 within the receiver package 10, it is contemplated that multiple leadframes 12 may be provided in a common leadframe strip. In this regard, since the receiver package 10 is well suited to strip based assembly and test capability, the assembly and testing thereof can be fully automated, thus substantially reducing the fabrication costs associated with the receiver package 10.

Figure 4:
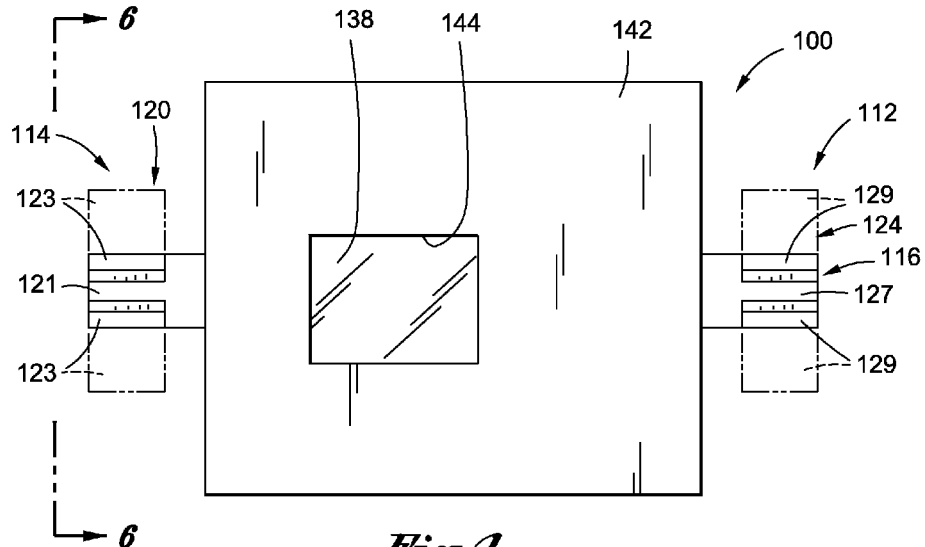
FIG. 4 is a top plan view of a CPV receiver package constructed in accordance with a second embodiment of the present invention.
Figure 5:
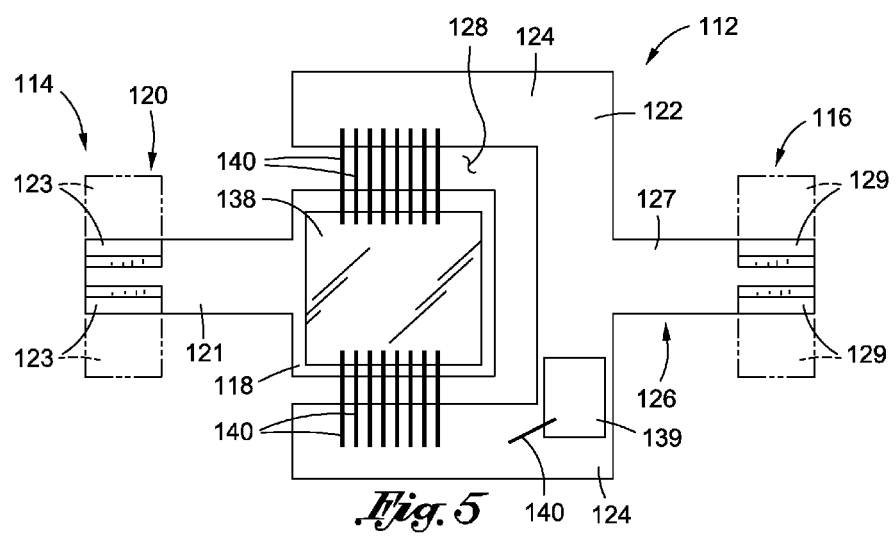
FIG. 5 is a top plan view of the CPV receiver package of the second embodiment similar to FIG. 4, but with the molded body removed for purposes of clearly depicting the leadframe of the CPV receiver package.
Figure 6:
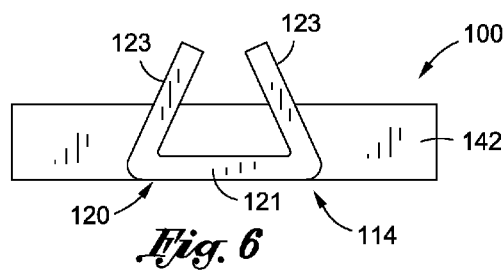
FIG. 6 is a side elevational view taken along line 6-6 of FIG. 4.

Referring now to FIGS. 4-6, there is shown a CPV module or receiver package 100 which is constructed in accordance with a second embodiment of the present invention. As best seen in FIG. 5, the receiver package 100 comprises a leadframe 112 which is preferably fabricated from a conductive metal material, such as copper. The leadframe 112 includes a first section 114 and a separate second section 116. The first section 114 includes a generally quadrangular (e.g., rectangular) die pad portion 118 which defines opposed pairs of longitudinally and laterally extending side edges. Extending from the approximate center of one of the laterally extending side edge of the die pad portion 118 is a generally T-shaped connector portion 120 of the first section 114. More particularly, the connector portion 120 includes a generally quadrangular (e.g., rectangular) main body 121 having a pair of connector wings 123 protruding from respective ones of the longitudinally extending side edges thereof in opposed relation to each other.

The second section 116 of the leadframe 112 includes a generally quadrangular (e.g., rectangular) base portion 122 defining opposed pairs of longitudinally and laterally extending side edges. In addition to the base portion 122, the second section 116 includes an identically configured pair of prong portions 124 which extend in spaced, generally parallel relation to each other from a common longitudinally extending side edge of the base portion 122. Additionally, extending from the longitudinally extending side edge of the base portion 122 opposite the side edge having the prong portions 124 extending therefrom is a generally T-shaped connector portion 126 of the second section 116, the connector portion 126 preferably being identically configured to the connector portion 120 of the first section 114. In this regard, the connector portion 126 includes a generally quadrangular (e.g., rectangular) main body 127 having a pair of connector wings 129 protruding from respective ones of the longitudinally extending side edges thereof in opposed relation to each other. As is further seen in FIG. 5, the base portion 122 and prong portions 124 of the second section 116 collectively define a generally square gap or recess 128 which is sized and configured to accommodate the die pad portion 118 of the first section 114. More particularly, in the leadframe 112, the first and second sections 114, 116 are oriented relative to each other such that the die pad portion 118 is disposed within the recess 128. However, the first and second sections 114, 116 are maintained in spaced relation to each other, with a continuous gap or void being defined therebetween as shown in FIG. 5. In the leadframe 112, the first section 114 is preferably of uniform thickness, as is the second section 116. The thicknesses of the first and second sections 114, 116 are also equal to each other, but may optionally be varied without departing from the spirit and scope of the present invention. However, though not shown, it is contemplated that the connector portions 120, 126 of the first and second sections 114, 116 may each be subjected to a partial etching process for reasons which will be discussed in more detail below.

As best shown in FIGS. 4 and 6, in the receiver package 100, connector wings 123, 129 of the connector portions 120, 126 of the first and second sections 114, 116 of the leadframe 112 are each bent upwardly and inwardly relative to a respective one of the main bodies 121, 127 when viewed from the perspective shown in FIG. 6. Thus, upon the bending of the connector wings 123, 129, the distal portion of each connector portion 120, 126 assumes a generally U-shaped profile, with the upwardly extending arms defined by each corresponding pair of connector wings 123, 129 being angled toward each other. Advantageously, the bent distal portions of the connector portions 120, 126 (i.e., the bent connector wings 123, 129 and corresponding main bodies 121, 127) each define a connector which is uniquely configured to facilitate the electrical connection of a corresponding cable to the leadframe 112, and hence the receiver package 100. As will be recognized, the connector of the first section 114 facilitates the electrical coupling of a cable thereto, with the connector of the second section 116 facilitating the electrical coupling of a cable thereto.

In the receiver package 100, the thickness of the connector portions 120, 126, and in particular the connector wings 123, 129, is preferably selected so as to allow for the bending thereof in the aforementioned manner without having to exert substantial force as could otherwise result in damage to the receiver package 100. As indicated above, to provide this characteristic, the thicknesses of at least the distal portions of the connector portions 120, 126 may be selectively reduced through the use of, for example, a partial or half-etching process prior to the bending thereof to form the connectors. It is contemplated that when connecting cables to the receiver package 100 through the use of respective ones of the connectors of the leadframe 112, the bending of the wing connectors 121, 127 will occur subsequent to the placement or positioning of portions of the cables onto respective ones of the main bodies 121, 127.

The receiver package 100 constructed in accordance with the present invention further comprises a receiver die 138, the back or bottom surface of which is mounted and electrically connected to the top surface of the die pad portion 118 of the first section 114 of the leadframe 112. The receiver die 138 has a generally quadrangular (e.g., square) configuration, and includes two contact strips disposed on the front or top surface thereof. The contact strips extend in spaced, generally parallel relation to each other along respective ones of an opposed pair of side edges of the receiver die 138. In the receiver package 100, each of the contact strips is electrically connected to a respective one of the prong portions 124 of the second section 116 of the leadframe 112 by a plurality of conductive wires 140. As shown in FIG. 5, it is contemplated that in addition to the receiver die 138, the receiver package 100 will include an electronic device 139 such as a packaged diode or a rectifier die attached to the top surface of the base portion 122 of the second section 116. The electronic device 139 will itself be electrically connected to one of the prong portions 124 of the second section 116 through the use of at least one conductive wire 140.

In the receiver package 100, the receiver die 138, the electronic device 139, the conductive wires 140 and portions of the first and second sections 114, 116 of the leadframe 112 are covered by an encapsulant material which, upon hardening, defines a molded body 142 of the receiver package 100. As seen in FIGS. 4 and 6, the body 142 has a generally square, frame-like configuration. More particularly, the body 142 is formed such that virtually the entire leadframe 112 is covered thereby, except for the majority of the connector portions 120, 126 and the bottom surfaces of the first and second sections 114, 116 (and thus the bottom surface of the die pad portion 118 of the first section 114). In this regard, the connector portions 120, 126 protrude from respective ones of an opposed pair of side surfaces defined by the body 142, with the bottom surfaces of the first and sections 114, 116, except for the portions defined by the bent connector wings 123, 129 of the connector portions 120, 126 forming the cable connectors, extending in substantially flush relation to a generally planar bottom surface defined by the body 142. Thus, the bottom surface of the die pad portion 118 of the first section 114 also extends in substantially flush relation to the bottom surface of the body 142. In the completed receiver package 100, the top surface of the receiver die 138, except for a peripheral portion thereof, is exposed in a generally quadrangular window 144 defined by the body 142 and formed within the approximate center of the generally planar top surface thereof. Though not shown, it is contemplated that the window 144 may have a tapered profile, i.e., those surfaces of the body 142 defining the window 144 may extend angularly from the top surface of the body 142 to the top surface of the receiver die 138. Though also not shown in FIG. 4, it is further contemplated that the body 142 may alternatively be formed such that portions of the prong portions 124 of the second section 116 of the leadframe 112 protrude slightly from respective ones of an opposed pair of side surfaces of the body 142. Those of ordinary skill in the art will recognize that the receiver package 100 may be used in the same operative environment and with the same ancillary structures as described above in relation to the receiver package 10, and may also be provided with the structural variations described above in relation to the receiver package 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A CPV receiver package, comprising:
a leadframe including a first section and a second section disposed in spaced relation to each other, the first and second sections each including a portion which is bent in a manner defining a connector which is sized and configured to facilitate the operative electrical coupling of an electrically conductive member to the leadframe without a supplemental connector, wherein each connector is further configured for engaging a respective electrically conductive members along a plane that is substantially parallel to the leadframe; and
a receiver die mounted to the first section, and electrically connected to each of the first and second sections.

2. The CPV receiver package of claim 1 wherein the receiver die is electrically connected to the second section of the leadframe by a plurality of conductive wires.

3. The CPV receiver package of claim 2 further comprising a molded body which covers the conductive wires, a portion of the receiver die, and portions of the first and second sections of the leadframe, the body defining a window in which a portion of the receiver die is exposed, with the connectors protruding from the body.

4. The CPV receiver package of claim 3 wherein the first section of the leadframe defines a die pad portion having opposed top and bottom surfaces, the receiver die being mounted and electrically connected to the top surface of the die pad portion, with the bottom surface of the die pad portion being exposed in the body.

5. The CPV receiver package of claim 3 wherein the first and second sections of the leadframe each include a connector portion which protrudes from the body and is bent in a manner defining a respective one of the connectors.

6. The CPV receiver package of claim 5 wherein the connector portions of the first and second sections of the leadframe protrude from the body in opposed relation to each other.

7. The CPV receiver package of claim 1 wherein:
the first section of the leadframe includes a first section distal end that is bent upwardly and inwardly such that the first section distal end is directed toward a top surface portion of the first section to provide the connector of the first section having a generally circular profile imparted thereto; and
the second section of the leadframe includes a second section distal end that is bent upwardly and inwardly such that the second section distal end is directed toward a top surface portion of the second section to provide the connector of the second section having a generally circular profile imparted thereto.

8. The CPV receiver package of claim 1 wherein portions of each of the first and second sections of the leadframe are bent in a manner which results in each of the connectors having a generally U-shaped profile imparted thereto.

9. The CPV receiver package of claim 1 wherein the first section of the leadframe includes a connector portion and a die pad portion which is attached to the connector portion and defines opposed top and bottom surfaces, the receiver die being mounted and electrically connected to the top surface of the die pad portion, with the connector portion of the first section being bent in a manner defining the connector of the first section.

10. The CPV receiver package of claim 9 wherein the second section of the leadframe includes a base portion, a connector portion extending from the base portion, and a spaced, generally parallel pair of prong portions which extend from the base portion and are each electrically connected to the receiver die, the connector portion of the second section being bent in a manner defining the connector of the second section.

11. The CPV receiver package of claim 10 wherein the prong portions of the second section extend in spaced, generally parallel relation to the die pad portion of the first section, the connector portion of the first section extends generally perpendicularly relative to the die pad portion thereof, and the connector portion of the second section extends generally perpendicularly relative to the prong portions thereof.

12. The CPV receiver package of claim 11 further comprising a body which is formed from a molded encapsulant material and partially covers the leadframe such that the bottom surface of the die pad portion of the first section is exposed in the body and the connectors defined by the connector portions of the first and second sections protrude from the body, the body defining a window in which a portion of the receiver die is exposed.

13. The CPV receiver package of claim 12 wherein the receiver die is electrically connected to the prong portions of the second section by conductive wires which are covered by the body.

14. A CPV receiver package, comprising:
a leadframe including:
a first section defining a die pad portion having opposed top and bottom surfaces and a connector portion attached to the die pad portion, the connector portion of the first section defining a connector which is formed as an integral portion thereof, and is sized and configured to facilitate the operative electrical coupling of an electrically conductive member to the first section, wherein the first section connector is further configured for engaging the electrically conductive member along a plane that is substantially parallel to the first section; and
a second section disposed in spaced relation to the first section, the second section including a base portion, a connector portion attached to the base portion, and a pair of prong portions attached to and extending from the base portion in spaced, generally parallel relation to each other, the die pad portion of the first section extending at least partially between the prong portions of the second section, with the connector portion of the second section defining a connector which is formed as an integral portion thereof, and is sized and configured to facilitate the operative electrical coupling of an electrically conductive member to the second section, wherein the second section connector is further configured for engaging the electrically conductive member along a plane that is substantially parallel to the second section;
a receiver die mounted and electrically connected to the die pad portion of the first section, and electrically connected to the prong portions of the second section by a plurality of conductive wires; and
a body which is formed from a molded encapsulant material and covers the conductive wires, a portion of the receiver die, portions of the die pad and connector portions of the first section of the leadframe, and portions of the base, connector and prong portions of the second section of the leadframe such that at least the bottom surface of the die pad portion of the first section, the connectors defined by the connector portions of the first and second sections, and a portion of the receiver die are exposed in the body.

15. The CPV receiver package of claim 14 wherein:
the connectors defined by the connector portions of the first and second sections of the leadframe protrude from the body in opposed relation to each other;

the connector of the first section is sized and configured to facilitate the operative electrical coupling of an electrically conductive member to the first section without a supplemental connector; and the connector of the second section is sized and configured to facilitate the operative electrical coupling of an electrically conductive member to the second section without a supplemental connector.

16. The CPV receiver package of claim 14 wherein each of the connectors has a generally circular profile.

17. The CPV receiver package of claim 14 wherein each of the connectors has a generally U-shaped profile.

18. A CPV receiver package, comprising:
a leadframe including:
a first section defining a die pad portion having opposed top and bottom surfaces and a connector portion which is attached to the die pad portion and adapted to be bendable into a connector which is formed as an integral portion thereof, and is sized and configured to facilitate the operative electrical coupling of an electrically conductive member to the first section without a supplemental connector; and
a second section disposed in spaced relation to the first section, the second section including a connector portion which is adapted to be bendable into a connector which is formed as an integral portion thereof, and is sized and configured to facilitate the operative electrical coupling of an electrically conductive member to the second section without a supplemental connector;
a receiver die mounted and electrically connected to the die pad portion of the first section, and electrically connected to the second section.

19. The CPV receiver package of claim 18 wherein one or more of the connectors is further configured to engage the electrically conductive member along a plane that is other than perpendicular to the leadframe.

20. The CPV receiver package of claim 18 wherein:
each of the connector portions has a configuration selected from group consisting of a generally T-shaped configuration and a generally rectangular configuration;
the connector of the first section is further configured to engage the electrically conductive member along a plane that is generally parallel to the first section; and
the connector of the second section is further configured to engage the electrically conductive member along a plane that is generally parallel to the second section.

* * * * *